United States Patent [19]
Tsoi

[11] Patent Number: 5,646,055
[45] Date of Patent: Jul. 8, 1997

[54] METHOD FOR MAKING BIPOLAR TRANSISTOR

[75] Inventor: Hak-Yam Tsoi, Scottsdale, Ariz.

[73] Assignee: Motorola, Inc., Schaumburg, Ill.

[21] Appl. No.: 641,393

[22] Filed: May 1, 1996

[51] Int. Cl.⁶ ............................................. H01L 21/265
[52] U.S. Cl. .................... 437/31; 437/21; 437/32; 437/59; 148/DIG. 9; 148/DIG. 10; 257/575
[58] Field of Search .................... 437/21, 31, 32, 437/59; 257/575; 148/DIG. 9

[56] References Cited

U.S. PATENT DOCUMENTS

| | | | |
|---|---|---|---|
| 3,923,553 | 12/1975 | Hayashi et al. | 148/1.5 |
| 4,050,965 | 9/1977 | Ipri et al. | 148/175 |
| 4,546,536 | 10/1985 | Anantha et al. | 29/571 |
| 5,045,912 | 9/1991 | Ohki | 357/43 |
| 5,070,381 | 12/1991 | Scott et al. | 357/35 |
| 5,100,810 | 3/1992 | Yoshimi et al. | 437/21 |
| 5,147,818 | 9/1992 | Hikida | 437/57 |
| 5,264,719 | 11/1993 | Beasom | 257/335 |
| 5,298,786 | 3/1994 | Shahidi et al. | 257/559 |
| 5,389,561 | 2/1995 | Gomi | 437/31 |
| 5,416,031 | 5/1995 | Miwa | 437/31 |
| 5,444,004 | 8/1995 | Jang | 437/32 |
| 5,449,627 | 9/1995 | Wang et al. | 437/31 |

*Primary Examiner*—John Niebling
*Assistant Examiner*—Long Pham
*Attorney, Agent, or Firm*—George C. Chen

[57] ABSTRACT

A bipolar transistor (10) includes a collector region (13), a base region (14) in the collector region (13), and an emitter region (20) in the base region (14). A portion (18) of an electrical conductor (16) is located over a base width (23) of the bipolar transistor (10). The emitter region (20) is self-aligned to the portion (18) of the electrical conductor (16) and is preferably diffused into the base region (14) in order to decrease the base width (23) without relying on extremely precise alignment between base region (14) and the portion (18) of the electrical conductor (16). The portion (18) of the electrical conductor (16) is used to deplete a portion of the base width (23) of the bipolar transistor (10).

18 Claims, 2 Drawing Sheets

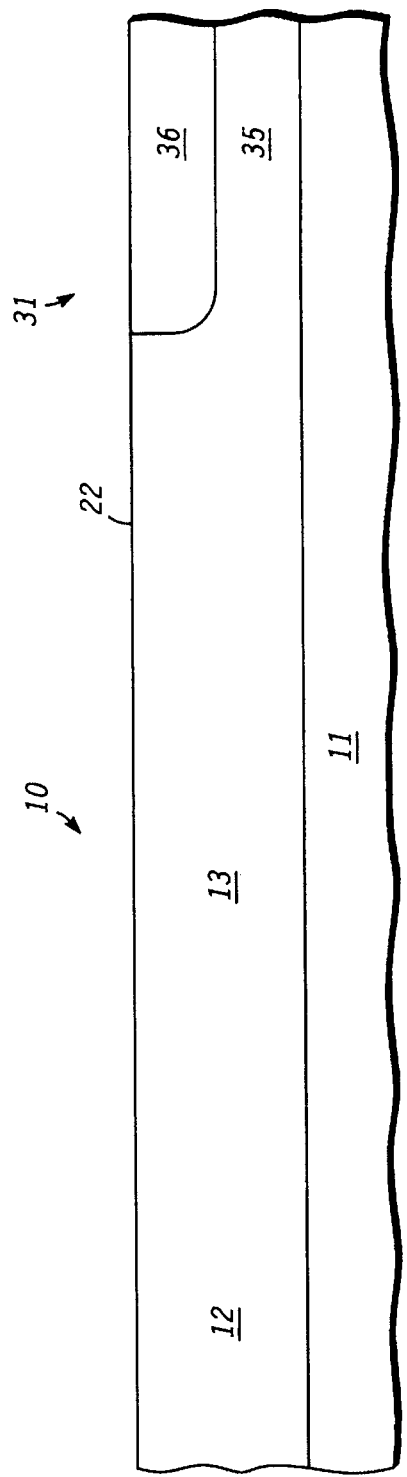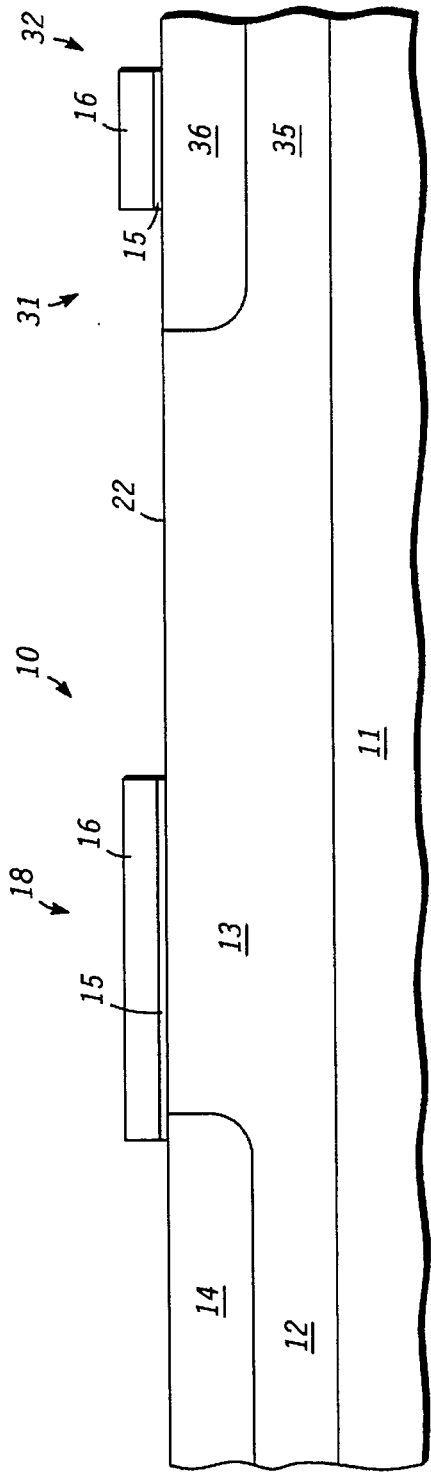

METHOD FOR MAKING BIPOLAR TRANSISTOR

BACKGROUND OF THE INVENTION

This invention relates, in general, to semiconductor devices, and more particularly, to bipolar transistors and methods of fabrication.

Many high voltage bipolar transistors are vertical devices, wherein a collector electrode is on one surface of a semiconductor substrate and wherein an emitter and a base electrode are on an opposite surface of the semiconductor substrate. The semiconductor substrate typically has a thickness greater than approximately 10 microns in order to provide sufficient physical separation between the collector and the emitter. The large physical separation increases the collector-to-emitter breakdown voltage and enables the vertical bipolar transistor to be used in high voltage applications. However, the large physical separation also increases the collector resistance, which degrades the drive capability and the speed of the vertical bipolar transistor.

Other high voltage bipolar transistors are lateral devices that have collector, emitter, and base contacts on the same side of a semiconductor substrate. However, lateral bipolar transistors typically have long base lengths and high parasitic capacitances between a base region and the underlying semiconductor substrate. As a result of these drawbacks, the speed and the gain of the lateral bipolar transistor is degraded.

Accordingly, a need exists for a bipolar transistor that has small parasitic resistances and capacitances, that is suitable for high speed applications, and that can be integrated into high voltage and high power technologies.

BRIEF DESCRIPTION OF THE DRAWINGS

FIGS. 1, 2, and 3 illustrate partial cross-sectional views of an embodiment of a bipolar transistor during fabrication and in accordance with the present invention.

DETAILED DESCRIPTION OF THE DRAWINGS

Figure 3:
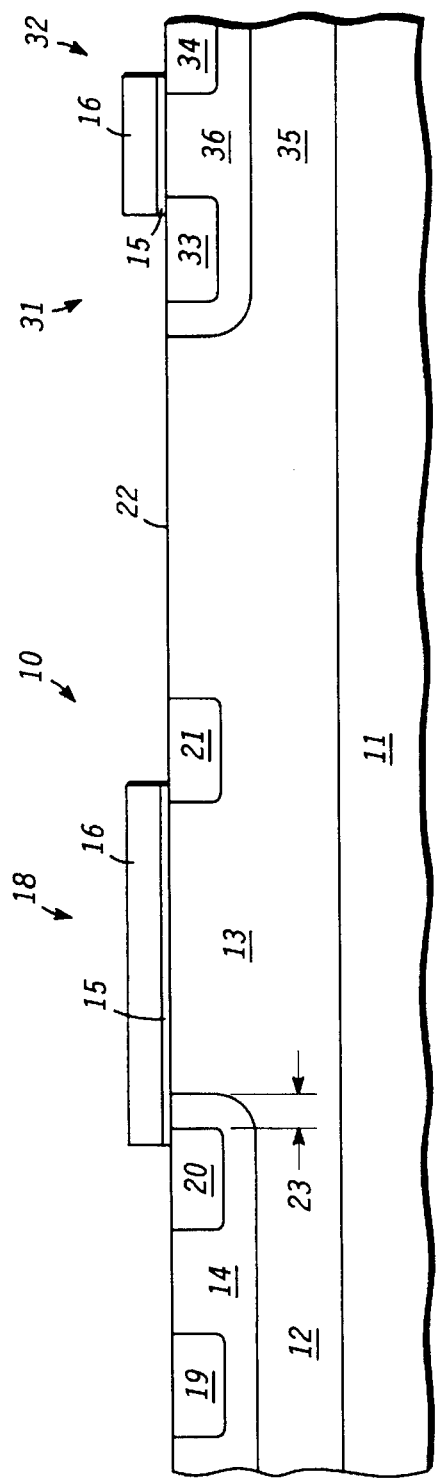

Turning to the figures for a more detailed description, FIG. 1 illustrates a partial cross-sectional view of a bipolar transistor 10. Transistor 10 is fabricated in a surface 22 of a semiconductor layer 12, wherein layer 12 overlies a substrate 11. Transistor 10 is a portion of an integrated circuit 30, which can optionally include a metal-oxide-semiconductor field effect transistor (MOSFET) 31. MOSFET 31 can be fabricated in a different portion 35 of layer 12. Therefore, circuit 30 can be a bipolar complementary metal-oxide-semiconductor (BiCMOS) circuit.

A portion of layer 12 serves as or forms a collector region 13 for transistor 10. Collector region 13 has a first conductivity type and has an appropriate doping level in order to minimize the parasitic resistance of collector region 13. To reduce the number of processing steps required to manufacture transistor 10, layer 12 is preferably doped during the deposition or growth of layer 12 over substrate 11. Thus, layer 12 and collector region 13 preferably have substantially similar doping levels in order to eliminate additional processing steps for doping collector region 13. As an example, layer 12 and collector region 13 can be a lightly doped n-type silicon homoepitaxial layer having a thickness greater than approximately 3 microns. In this example, layer 12 can be grown on substrate 11 by using epitaxial growth techniques known to those skilled in the art.

A doped region 36 can be formed in portion 35 of layer 12 using implantation or diffusion techniques known in the art. Region 36 can define a well structure of MOSFET 31. When layer 12 is of the first conductivity type, region 36 can have a second conductivity type that is different from the first conductivity type. For example, if layer 12 is n-type, then region 36 can be p-type.

Continuing with FIG. 2, a partial cross-sectional view of transistor 10 and circuit 30 is depicted after subsequent processing. It is understood that the same reference numerals are used in the figures to denote the same elements.

In FIG. 2, an electrical insulator 15 is provided or formed over surface 22 of layer 12, and an electrical conductor 16 is provided or formed over surface 22 and insulator 15. Then, conductor 16 and insulator 15 are patterned into portions 18 and 32 using etching techniques known in the art. Portion 18 of conductor 16 and insulator 15 overlies a portion of collector region 13, and portion 32 of conductor 16 and insulator 15 overlies a portion of doped region 36.

After the formation of portions 18 and 32, base region 14 is formed in and is located in collector region 13 of layer 12. Base region 14 has the second conductivity type and is self-aligned to portion 18. Base region 14 can be implanted into layer 12 or diffused into layer 12 so that a portion of base region 14 underlies portion 18 for reasons explained hereinafter. As an example, base region 14 can be formed to have a sheet resistivity of less than approximately 300 ohms per square and can also have a depth of less than 2 microns into layer 12

In transistor 10, the depth of base region 14 and the thickness of layer 12 do not limit the collector resistance because transistor 10 is not a vertical bipolar transistor. Instead, transistor 10 is a lateral bipolar transistor, wherein the base, collector, and emitter electrodes (not shown) are all on the same surface of layer 12. Thus, the depth of base region 14 can be shallower than that of a conventional bipolar transistor so that the doping level of base region 14 can be higher than that of a conventional bipolar transistor. With a higher doping level in base region 14, the base resistance of transistor 10 can be reduced without detrimentally affecting the collector resistance. Furthermore, with a smaller base resistance, transistor 10 is more suitable for high speed applications compared to the prior art.

Portion 18 of conductor 16 is electrically coupled to base region 14 and collector region 13 to enhance the operation of transistor 10, as discussed hereinafter. However, for proper operation of transistor 10, conductor 16 should be devoid of direct contact with layer 12 in order to prevent the electrical shorting between base region 14 and collector region 13. Therefore, insulator 15 is located between layer 12 and conductor 16 to prevent the aforementioned electrical shorting.

Preferably, insulator 15 and conductor 16 are also used as a gate insulator and a gate electrode, respectively, for circuit 30. In this preferred embodiment, portion 32 of conductor 16 and insulator 15 form a polysilicon gate electrode and a silicon dioxide gate insulator, respectively, for MOSFET 31. Thus, the number of manufacturing steps required to make circuit 30 is further reduced because conductor 16 and insulator 15 can be used for both MOSFET 31 and transistor 10. As an example, insulator 15 can be a thermally grown silicon dioxide layer having a thickness of less than approximately 500 angstroms (Å), and conductor 16 can be a chemical vapor deposited polysilicon layer having a thickness of greater than approximately 1,000 angstroms.

Referring now to the FIG. 3, a partial cross-sectional view of transistor 10 and circuit 30 is depicted after additional processing. A base contact region 19, an emitter region 20, and a collector contact region 21 are located in layer 12. As an example, base contact region 19, emitter region 20, and collector contact region 21 can be formed using implantation techniques and anneal techniques or diffusion techniques.

A first masking layer (not shown) is provided over surface 22 of layer 12 to selectively form emitter region 20 in base region 14 of layer 12 and to selectively form collector contact region 21 in collector region 13 of layer 12. Emitter region 20 and collector contact region 21 have the first conductivity type and have a higher doping concentration than collector region 13. Emitter region 20 and collector contact region 21 are preferably simultaneously formed using a single masking layer in order to reduce the number of manufacturing steps required to make transistor 10.

Furthermore, emitter region 20 and collector contact region 21 are preferably self-aligned to portion 18 of conductor 16 and insulator 15 in order to simplify the manufacturing of transistor 10. By self-aligning both emitter region 20 and collector contact region 21 to portion 18, the distance between emitter region 20 and collector contact region 21 is not limited by the resolution of lithography techniques. For instance, although lithography limitations may limit the minimum feature size for an etch mask (not shown) used to form portion 18, the etch mask can be undercut so that portion 18 is overetched and is smaller than the overlying etch mask. Now, with portion 18 smaller than the lithography resolution, emitter region 20 and collector contact region 21 are self-aligned to portion 18 in order to have a small distance between emitter region 20 and collector contact region 21. Thus, the distance between emitter region 20 and collector contact region 21 can be reduced compared to the prior art, and by reducing the emitter-to-collector spacing, the parasitic collector resistance can be reduced over the prior art. Furthermore, the speed of transistor 10 can be increased over the prior art. As an example, the distance between emitter region 20 and collector contact region 21 can be less than 2 microns.

It is also understood that the first masking layer can also be used to simultaneously form a source region 33 and a drain region 34 of MOSFET 31 with emitter region 20 and collector contact region 21 in order to reduce the number of processing steps required to fabricate circuit 30.

After removal of the first masking layer, a second masking layer (not shown) can then be provided over surface 22 to selectively form base contact region 19 in base region 14 of layer 12, wherein base contact region 19 has the second conductivity type and has a higher doping concentration than base region 14. Techniques used to form emitter region 20 and collector contact region 21 can also be used to form base contact region 19. One skilled in the art will understand that base contact region 19 can be formed prior to the formation of emitter region 20 and collector contact region 21.

Transistor 10 has a base width 23 that is formed and located in a first portion of base region 14 located between emitter region 20 and collector region 13 and located underneath portion 18. Base width 23 extends along a direction substantially parallel to surface 22 of layer 12. A smaller base width 23 can improve the high speed performance of transistor 10. Therefore, to minimize base width 23, base region 14 and emitter region 20 are preferably formed using a double diffusion technique because a smaller base width 23 can be achieved by diffusing emitter region 20 within base region 14 compared to simply using an implantation and anneal technique.

By diffusing emitter region 20, the edge of emitter region 20 will extend underneath portion 18 of insulator 15 toward collector region 13. The edge of base region 14 is already located underneath portion 18 because of an earlier diffusion step. However, the edge of base region 14 will also diffuse further underneath portion 18 during the diffusion process for emitter region 20. Therefore, base width 23 is defined by the difference in diffusion lengths between base region 14 and emitter region 20 because base region 14 and emitter region 20 are both self-aligned to portion 18. The use of two separate diffusion processes facilitates the fabrication of a smaller base width 23 without requiring an increase in lithography alignment precision. In this manner, the size of base width 23 is not limited by lithographic alignment tolerances as in the prior art. As an example, base width 23 can be less than approximately 1.5 microns.

Furthermore, when a first diffusion process is used to fabricated base region 14 and a second diffusion process is used to fabricate emitter region 20 and collector contact region 21, the double diffusion process of transistor 10 is more compatible with a double diffusion process that can be used to manufacture MOSFET 31. MOSFETs manufactured using a double diffusion process are known in the art as doubly diffused MOSFETs or DMOS.

Portion 18 of conductor 16 overlies and is electrically coupled to, but does not directly contact, a portion of base region 14 identified as base width 23. During the operation of transistor 10, portion 18 of conductor 16 can be unbiased or can be at a floating potential. However, portion 18 of conductor 16 is preferably biased at a substantially constant voltage potential in order to improve the performance of transistor 10 by not depleting or inverting the portion of base region 14 located beneath portion 18. By not depleting or inverting the portion of base region 14, a parasitic MOSFET action is suppressed while the bipolar action of transistor 10 is enhanced. As an example, portion 18 of conductor 16 can be electrically coupled or shorted to an emitter electrode (not shown) that is coupled to emitter region 20.

It is understood that a small base width 23 can also be achieved by using a diffusion step for base region 14 and by eliminating the diffusion step for emitter region 20. However, if the emitter region diffusion step is eliminated, portion 18 may not sufficiently overlap base width 23 to prevent the aforementioned parasitic MOSFET action in base width 23. Therefore, by using the second diffusion step, which drives emitter region 20 underneath portion 18 and which drives base region 14 further underneath portion 18, base width 23 will be more reliably located underneath portion 18 to eliminate the parasitic MOSFET action in base width 23.

Figure 4:
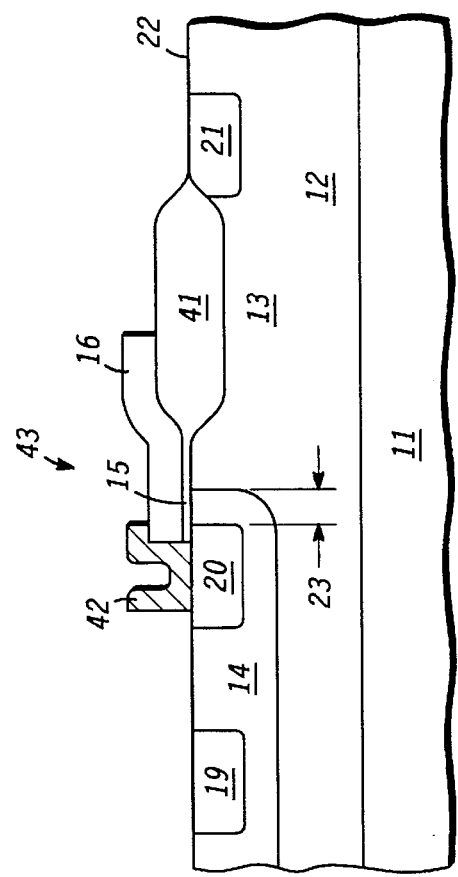
FIG. 4 portrays a partial cross-sectional view of an alternative embodiment of a bipolar transistor in accordance with the present invention.

FIG. 4 portrays a partial cross-sectional view of a bipolar transistor 40 that is an alternative embodiment of transistor 10 of FIG. 3. Under normal operation of transistor 10 of FIG. 3, the collector-to-emitter breakdown voltage can be limited by the electrical breakdown of insulator 15 located between collector contact region 21 and portion 18 of conductor 16. A thinner insulator 15 decreases the collector-to-emitter breakdown voltage, and a thicker insulator 15 increases the collector-to-emitter breakdown voltage. Thus, the thickness of conductor 16 can be increased to enhance the high voltage performance of transistor 10. However, insulator 15 should not be too thick because insulator 15 is also preferably used as a gate insulator for MOSFET 31 to simplify the manufacturing of circuit 30.

Therefore, in FIG. 4, a field oxide region 41 is formed over collector region 13 to increase the collector-to-emitter breakdown voltage of transistor 40 while maintaining the simplicity of the fabrication process for circuit 30. Oxide region 41 can be disposed over collector region 13 and under portion 18 of conductor 16. Oxide region 41 can be thermally grown during a device isolation step known in the art.

Portion 43 of transistor 40 is similar to portion 18 of FIG. 3. Portion 43 includes a portion of conductor 16, a portion of insulator 15, and field oxide region 41, which is located adjacent to insulator 15 and which is located between layer 12 and conductor 16. Base width 23 is located beneath a portion of portion 43.

Transistor 40 also includes an emitter electrode 42 overlying and electrically coupled to emitter region 20. Emitter electrode 42 is electrically coupled to portion 43 of conductor 16. Emitter region 20 and collector contact region 21 are self-aligned to portion 43. More specifically, collector contact region 21 is self-aligned to field oxide region 41 of portion 43, and emitter region 20 is self-aligned to conductor 16 and insulator 15 of portion 43. Field oxide region 41 improves the high voltage performance of transistor 40 over that of transistor 10 because field oxide region 41 is thicker than insulator 15 of FIG. 3. The high voltage performance of transistor 40 can be further improved by increasing the distance between collector contact region 21 and portion 43 of conductor 16, as depicted in FIG. 4.

Therefore, in accordance with the present invention, it is apparent there has been provided an improved bipolar transistor that overcomes the disadvantages of the prior art. Many of the parasitic resistances of the bipolar transistor are reduced without requiring the use of a highly doped buried layer. Consequently, the bipolar transistor has an improved high speed performance that is compatible with high voltage applications. Furthermore, the switching speed of the bipolar transistor is not limited by the thickness of the semiconductor layer or epitaxial layer in which the bipolar transistor is fabricated because the bipolar transistor is not a conventional vertical device. Additionally, the method of manufacturing the bipolar transistor is compatible with fabricating doubly diffused and other MOSFETs in the same semiconductor layer. Moreover, the base width of the bipolar transistor is not limited by lithographic alignment and resolution capabilities.

While the invention has been particularly shown and described with reference to preferred embodiments, it will be understood by those skilled in the art that changes in form and detail may be made without departing from the spirit and scope of the invention. For instance, layer 12 and substrate 11 may comprise a silicon-on-insulator (SOI) substrate. Additionally, device isolation features such as, for example, localized oxidation of silicon (LOCOS) structures can be included in circuit 30 to provide electrical isolation between transistor 10 and MOSFET 31. Accordingly, the disclosure of the present invention is not intended to be limiting. Instead, the disclosure of the present invention is intended to be illustrative of the scope of the invention, which is set forth in the following claims.

I claim:

1. A method of fabricating an integrated circuit comprising the steps of:
    providing a substrate;
    providing an epitaxial layer overlying the substrate, the epitaxial layer having a surface and a thickness, a portion of the epitaxial layer forming a collector region of a first conductivity type;
    forming an electrical conductor overlying a portion of the surface of the epitaxial layer and a portion of the collector region;
    forming a base region of a second conductivity type in the epitaxial layer and self-aligned to the electrical conductor, the base region having a depth in the epitaxial layer wherein the depth is less than the thickness of the epitaxial layer; and
    forming a base width in the base region by forming an emitter region of the first conductivity type in the base region, the base width being a portion of the base region between the emitter region and the collector region, the emitter region self-aligned to the electrical conductor.

2. The method according to claim 1 wherein the step of forming the electrical conductor includes simultaneously forming the electrical conductor for a bipolar transistor and for a field effect transistor, wherein the electrical conductor is a gate electrode for the field effect transistor and wherein the integrated circuit includes the bipolar transistor and the field effect transistor.

3. The method according to claim 1 further comprising the step of forming a field oxide region over a portion of the collector region, wherein the step of forming the base width includes forming a collector contact region, the field oxide region located between the collector contact region and the base region, wherein the step of forming the electrical conductor includes forming the electrical conductor over a portion of the field oxide region, and wherein the electrical conductor is absent over a different portion of the field oxide region.

4. The method according to claim 3 wherein the step of forming the collector contact region includes self-aligning the collector contact region to the field oxide region wherein the collector contact region is devoid of self-alignment with the electrical conductor.

5. The method according to claim 1 further comprising electrically coupling the electrical conductor and the emitter region.

6. The method according to claim 1 wherein the step of providing the epitaxial layer includes providing a substantially similar doping level for the epitaxial layer and the collector region.

7. The method according to claim 1 further comprising providing an electrical insulator between the electrical conductor and the epitaxial layer.

8. The method according to claim 1 wherein the step of forming the base region includes forming the base region with a resistance of less than approximately 300 ohms per square.

9. The method according to claim 1 wherein the step of forming the base width includes forming the base width in a direction approximately parallel to the surface of the epitaxial layer.

10. The method according to claim 9 wherein the step of forming the base width includes forming the base width to be less than approximately 1.5 microns.

11. The method according to claim 1 wherein the step of forming the base width includes forming the base width underneath the electrical conductor.

12. The method according to claim 1 wherein the step of forming the base width includes providing a depth for the emitter region wherein the depth of the emitter region is less than the depth of the base region.

13. The method according to claim 3 wherein the step of forming the collector contact region includes self-aligning the collector contact region to the different portion of the field oxide region and simultaneously forming the collector contact region and the emitter region.

14. The method according to claim 3 further comprising providing an electrical insulator between the electrical conductor and the epitaxial layer wherein the electrical insulator is adjacent to the field oxide region.

15. The method according to claim 14 wherein the step of forming the field oxide region includes providing a thickness of greater than approximately five hundred angstroms for the field oxide region and wherein the step of providing the electrical insulator includes providing a thickness of less than approximately five hundred angstroms for the electrical insulator.

16. The method according to claim 15 wherein the step of forming the collector contact region includes forming the collector contact region simultaneously with the emitter region and self-aligning the collector contact region to the field oxide region.

17. The method according to claim 16 wherein the step of self-aligning the collector contact region includes self-aligning the collector contact region to the different portion of the field oxide region.

18. The method according to claim 5 wherein the step of electrically coupling the electrical conductor and the emitter region includes forming an emitter electrode over the emitter region and over a portion of the electrical conductor wherein the emitter electrode physically contacts the emitter region and the electrical conductor.

* * * * *